INVENTOR
KEEFER S. STULL, JR.
BY Claude Funkhouser
ATTORNEY

Sept. 24, 1968 K. S. STULL, JR 3,403,347

HIGH ACCURACY INSTANTANEOUS INTERMEDIATE FREQUENCY LOGARITHMIC AMPLIFIER

Filed Feb. 15, 1965 5 Sheets-Sheet 2

United States Patent Office 3,403,347
Patented Sept. 24, 1968

3,403,347

HIGH ACCURACY INSTANTANEOUS INTERMEDIATE FREQUENCY LOGARITHMIC AMPLIFIER

Keefer S. Stull, Jr., Baltimore, Md., assignor, by mesne assignments, to the United States of America as represented by the Secretary of the Navy Filed Feb. 15, 1965, Ser. No. 432,909
7 Claims. (Cl. 329—145)

ABSTRACT OF THE DISCLOSURE

A device for substantially instantaneous logarithmic response to input signals by utilizing successive detection technique and employing grid limited IF stages. The detector outputs are added in a delay line and presented at the output, the output thus being a logarithmic function of the input signal.

Figure 1:
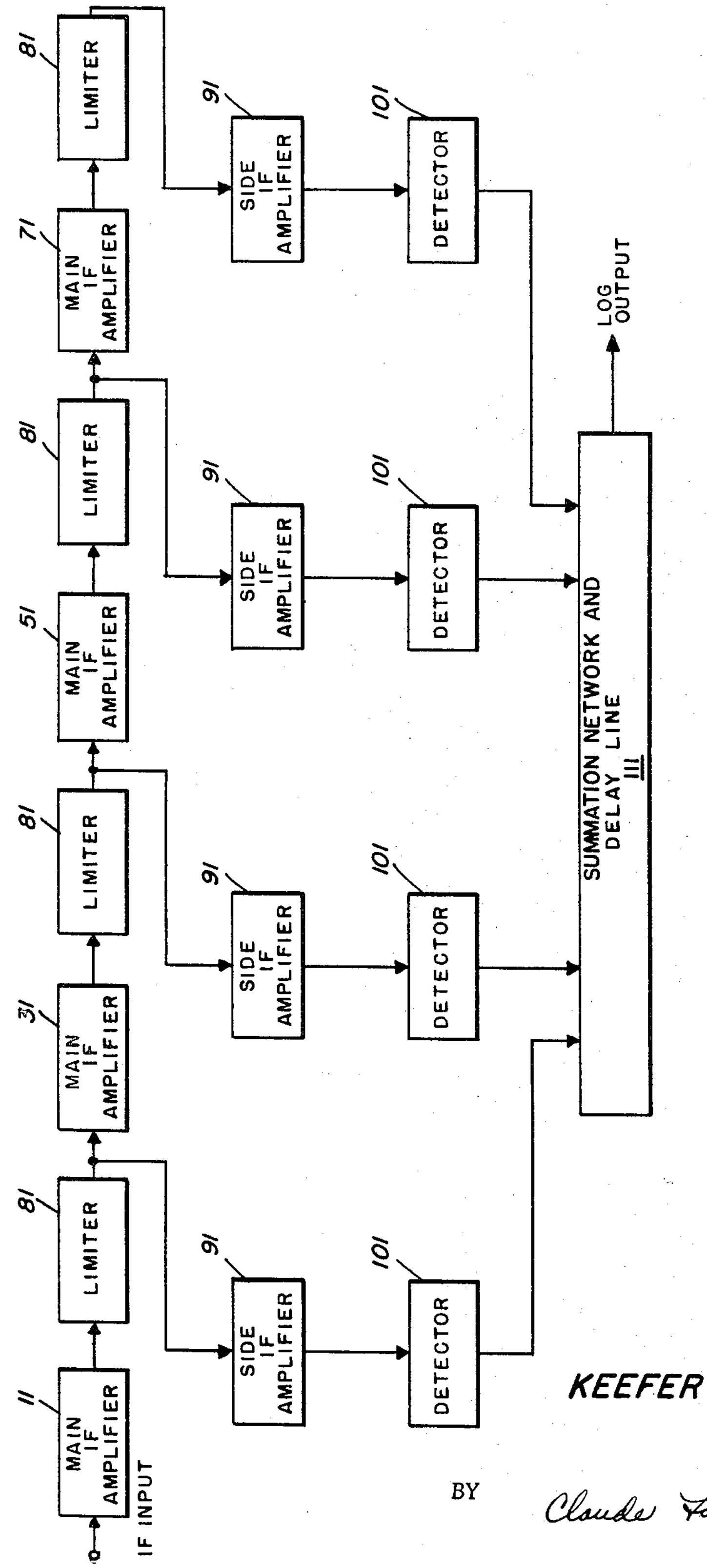

The present invention relates to logarithmic amplifiers and more particularly to logarithmic amplifiers using successive stages in cascade.

The prior art abounds with methods and devices for obtaining logarithmic amplitude responses in an IF amplifier. Most common of these methods operates IF amplifier tubes in such a manner that they will back bias, upon detection of strong signals, until the gain in each stage is reduced to unity. The signal at each stage is detected and the outputs of the cascaded stages are added to produce signals, the amplitude of which is a logarithmic function of the IF input amplitude. Another method of detection, that is often employed, is to utilize that component of plate current which exists when the IF tubes are back biased, either by taking a drop across the cathode resistor or, by taking the drop across a resistor in the plate circuit.

In any event, no matter which of these prior art detection devices is used, they cannot change their bias voltage instantaneously when the input signal level changes, because of the inherent RC time constant in the cathode circuit of the cascaded stages. In order that the back bias action is obtained, the cathode resistor must be larger than that normally used. The cathode capacitance, in order to provide sufficient IF bypassing, must not be much smaller than normal. The absolute minimum time constant obtainable is great enough to affect the bias of several stages when there is a change in signal level and thus, the overall time constant is increased with this large RC time constant.

When operating upon a pulsed signal, a large overshoot at the leading edge of the pulse is caused which decays back to the proper logarithm level, after a fairly long time period. Therefore, it is quite impossible to obtain true logarithmic response when the input signal consists of fractional microsecond pulses. Also, due to the long time constant, the amplifier is desensitized for a fraction of a microsecond after a strong signal is removed. This causes the wrong response to a weak signal which might follow close behind a strong pulse. Thus, the conventional back biased sequential detector circuit does not have the instantaneous response needed in many situations.

Another method of obtaining logarithmic response is to sequentially switch the gain of the device from receipt of one pulse to receipt of the next pulse. The response of such a system is logarithmic only after averaging the responses over an entire sequence of gain setting. The effect of this method obviously does not produce an instantaneous response.

Still another method of obtaining logarithmic response is to place resistance of a nominal value across each coupling circuit in an otherwise normal IF amplifier. At low signal levels, the resistance value is conventional, but at high signal levels, the resistance level must be reduced by a factor approximately equal to the normal gain per stage. The switching in of resistance values must occur at a low enough voltage level so that the strongest signal will not drive the grid of any of the stages into excessive non-linearity. The IF output signal of the last stage will then be approximately equal to the logarithm of the input signal. With such a system, the response to input signals is instantaneous. However, it is very difficult to obtain high accuracy in such a system, in that the switching causes many problems.

Thus, it may be easily seen that high accuracy requires a signal voltage level at which the resistance value must be switched and the high to low resistance ratios must be constant for all stages and under all conditions. Since the linear grid-swing of a typical IF amplifier tube is approximately one volt, and since the typical amplifier will have about five stages, the switching level on the last stage grid must be approximately one fifth of that value or 0.2 volt. The only device presently known that switches at this level is a germanium diode. A germanium diode, however, is not suitable for such an application, since its breakdown voltage level is temperature sensitive, and at IF frequencies its characteristics are not very predictable.

The present invention provides an instantaneous IF logarithmic amplifier by using the successive detection technique and employing grid limited IF stages. This permits instantaneous response since it does not operate any of the tubes into excessive non-linearity upon receipt of strong signals. This device also permits high accuracy because all of the critical operating parameters are adjustable as will be seen hereinafter. Further, temperature stability is maintained through temperature compensating devices and these two parameters are very stable because of the DC degeneration technique used.

An object of the present invention is the provision of an instantaneous IF logarithmic amplifier.

A further object of the invention is the provision of an instantaneous IF logarithmic amplifier with temperature compensation.

Yet another object of the present invention is the provision of an IF logarithmic amplifier that is stable upon receipt of extremely high signals and further will receive and detect low level signals after the receipt of such high level signals.

Further object of the present invention is the provision of an instantaneous high logarithmic amplifier which operates at a high enough level for linear operation.

Figure 2A:
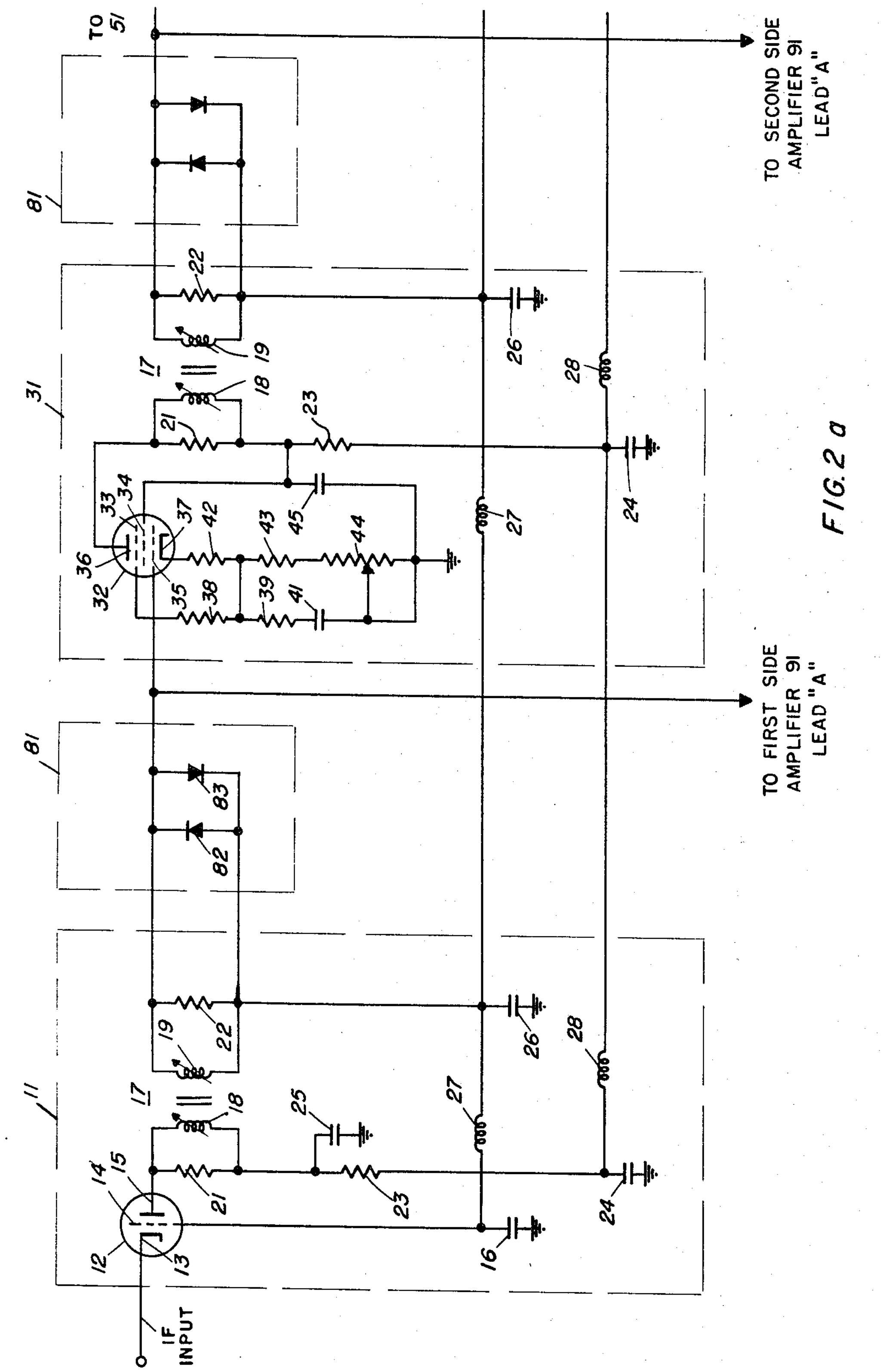
Figure 2B:
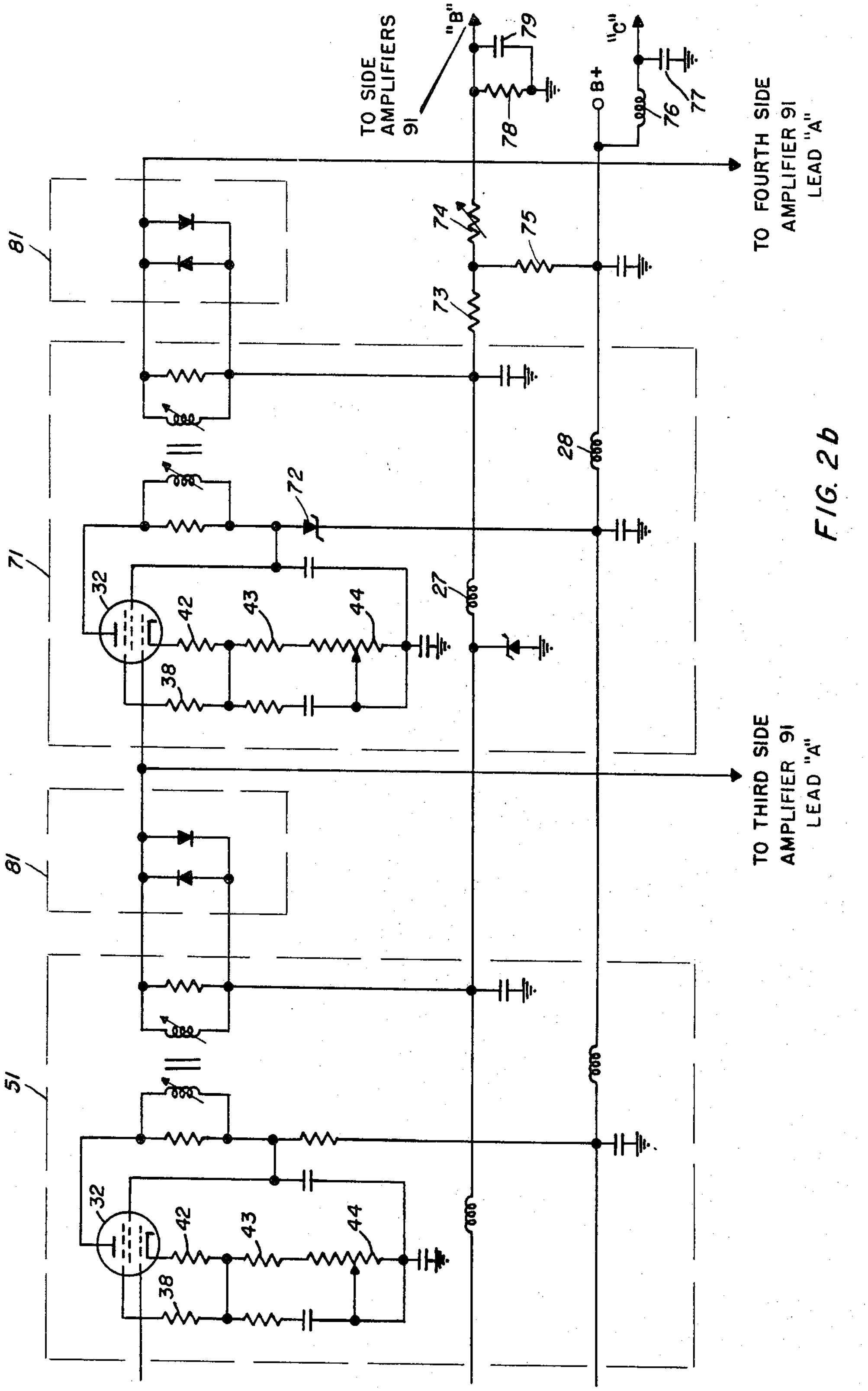
Figure 3:
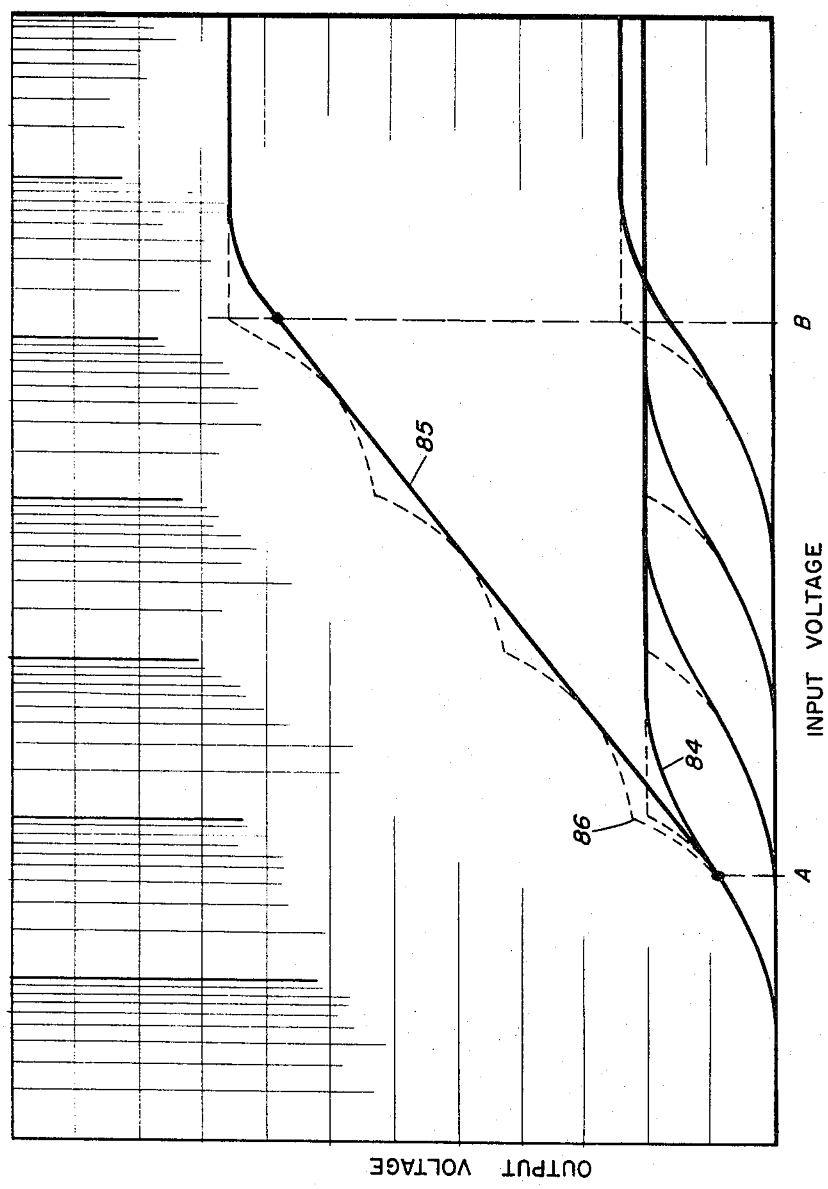
Figure 4:
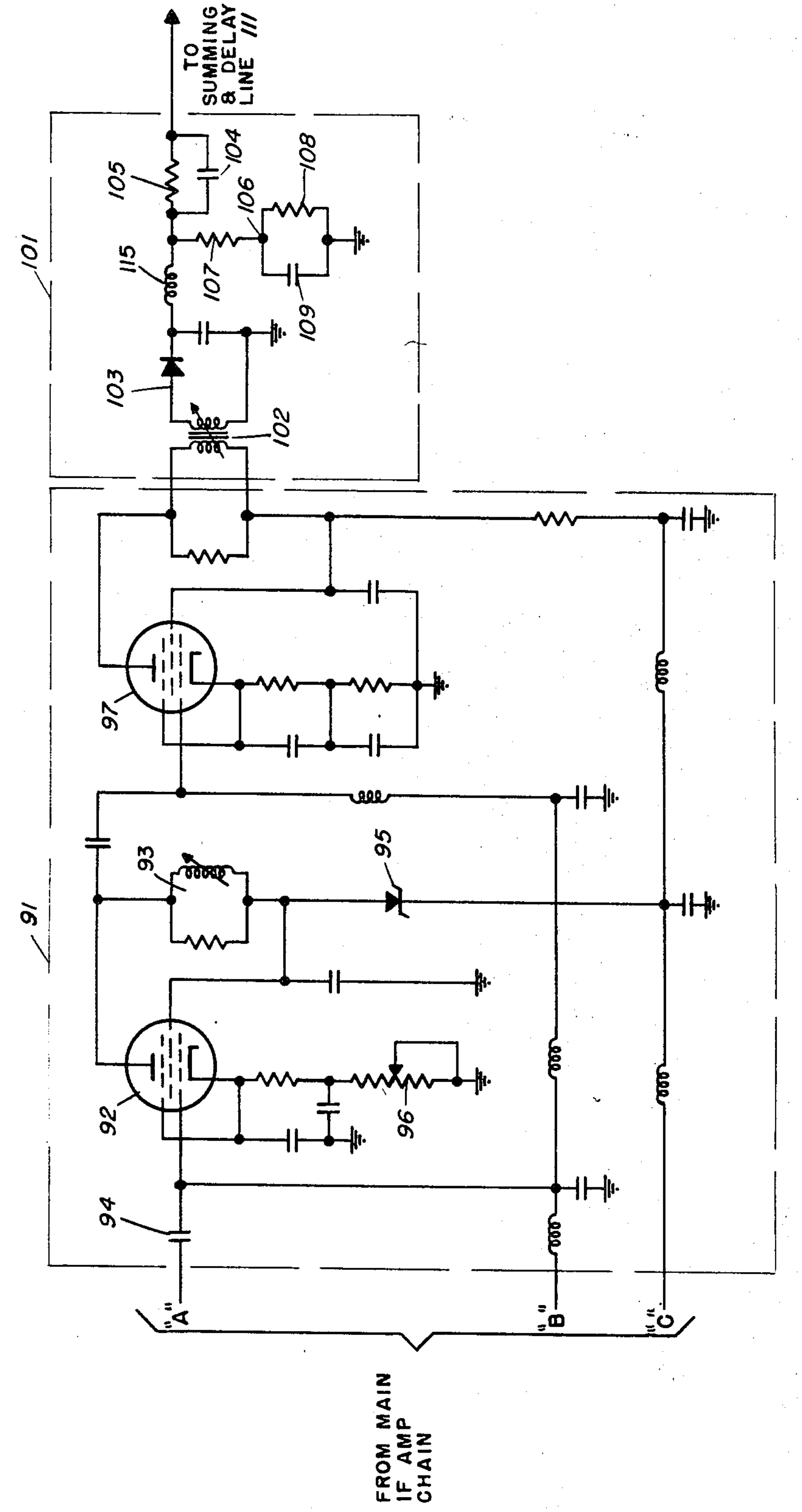

Other objects and many of the attendant advantages of this invention will be readily appreciated as the same becomes better understood by reference to the following detailed description when considered in conjunction with the accompanying drawings in which like reference numerals designate like parts throughout the various figures thereof and wherein:

FIG. 1 shows a block diagram of an embodiment of the invention;

FIG. 2, a two-sheet figure composed of sheets 2*a* and 2*b*, depicts a schematic drawing of the main chain of amplification of the embodiment shown in FIG. 1;

FIG. 3 illustrates a graph of the input to output characteristics of the embodiment shown in FIG. 1; and FIG. 4 depicts a schematic drawing of the side amplifiers and detectors shown in FIG. 1.

Referring now to the drawings, FIG. 1, which illustrates a block diagram of an embodiment of the invention, shows main IF amplifiers 11, 31, 51 and 71. Each of the amplifiers feeds a limiter 81. Each limiter associated with an IF amplifier feeds the succeeding main IF amplifier. For example, the limiter 81, associated with and fed by the main IF amplifier 11, in turn, feeds the main IF amplifier 31. Also associated with each of the main IF amplifiers 11, 31, 51 and 71 are side amplifiers 91. Each main IF amplifier feeds one of the side IF amplifiers through its associated limiter 81. In turn, each of the side IF amplifiers feeds a detector stage 101, the outputs of which are connected to a summation network and delay line 111. The output of the delay line 111 is the logarithmic output of the device.

The main IF amplifier chain consisting of amplifiers 11, 31, 51 and 71 alone form a conventional cascade amplifier. The addition of the limiters 81 inserted into this main chain of amplification prevent saturation of the amplifiers upon receipt of strong or high magnitude signals. Each main IF amplifier stage has a corresponding side IF amplifier stage 91. The side amplifiers each drive a detector circuit 101 at a level high enough for linear operation. The various detector outputs are added together, producing the output signal of the device. This addition is accomplished in a summation and delay network 111. The delay in the line is equal to the delay of each stage. If a very wide band width signal is utilized, there is no need for a delay line and a conventional resistive summation network may be used since, in such an application, the delays inherent in the main IF amplification chain may be neglected.

By utilizing the limiter 81, the limiting level may be as high as the grid swing of the main IF amplifiers, because the limit level may be of as high a value as the linear grid swing in the main amplifier cascade since the limiters essentially "hard" limit. For high accuracy, the effective limit level is held at a fixed value and if the detectors are fed through a separate side circuit, it is necessary to adjust the gain of each of side amplifiers 91 to compensate for limit level changes. An adjustment on each side amplifier 91 is used to set each stage to produce an exact detector output value as required for the desired accuracy. This adjustment compensates for the variations between the various limiter stages 81, gain of the amplifiers 11, 31, 51 and 71, side amplifier 91 and detectors 101. Variations due to aging and the like are reduced by operating at a high positive bias and using large cathode resistors for high DC devaluation.

To give optimum weak signal detectability, the pulse in the main amplifier chain is rounded by limiting and the base of the pulses is stretched to approximately three times the input pulse width. When a strong signal is received, each side amplifier 91 samples a different amplitude slice of this distorted pulse and the output of each detector 101 will have a different pulse width, the narrowest output pulse from the first detector in the chain and the widest from the last. The output pulses from the detectors are added and delayed to produce a distorted output pulse which is the log of the rounded pulse mentioned hereinbefore. Since the logarithm response compresses the top of the pulse and expands the bottom of the pulse, the major portion of the output pulse will be stretched to more than three times the input pulse width. Obviously, such a condition cannot be tolerated. The amplifier of the present invention solves this problem by maintaining a very wide band width in the IF amplifier chain and narrowing the band width of the side amplifiers to a value that gives optimum weak signal detection. Thus, the pulse shape remains relatively constant throughout the entire main chain and each side amplifier essentially samples a signal of the same pulse width. Hence, the output pulse will not vary in width or shape with changes in amplitude of the input.

Turning now to FIG. 2, there is shown a schematic drawing of the main amplifier chain as represented in FIG. 1 by amplifiers 11, 31, 51, 71 and their associated limiters 81.

The amplification stage 11 consists of a triode 12 having cathode grid and plate 13, 14 and 15, respectively. The input signal to the device comes in on the cathode terminal 13. The output of the triode is taken from terminal 15. The grid goes to ground point through capacitor 16. A double tuned transformer 17 having a primary 18 and a secondary 19 is connected to the output of the triode 12. Across the primary and secondary of transformer 17 are resistors 21 and 22. The other end of the primary 18 and its associated resistor 21 is tied to ground point through a resistor 23 and a capacitor 24. Between the junction of resistors 21 and 23 is a capacitor 25; the other end of the capacitor is grounded. The secondary 19 of the transformer 17 goes to ground point through a capacitor 26. Between the capacitors 16 and 26, an RF coil 27 is connected, and between the junction of resistors 23 and capacitor 24, another RF coil 28 is connected. The output of the secondary winding 19 of transformer 17 is connected to limiter stage 81. This consists of parallel semiconductor diodes 82 and 83 connected across the secondary of the transformer in opposite polarity relationship. Coming from the anode of diode 83 is a lead that goes to the first of the side amplifiers 91. This lead is labeled A. Also coming from this point is a lead which goes to a pentode 32 which forms a portion of the amplification stage 31.

The stage 31 of the main IF amplifier chain is composed of a pentode 32 having suppressor, screen and control grids 33, 34 and 35, plate 36 and cathode 37. The signal from limiter 81, mentioned hereinbefore, connects directly to the control grid 35. The suppressor grid is connected to ground point through resistors 38, 39 and capacitor 41. The cathode 37 of the tube 32 is also connected to this ground point through resistor network consisting of resistors 42, 43 and variable resistor 44. Between the junction of the ground point and capacitor 41 is the variable tap of the resistor 44. The screen grid 34 is also connected to this ground point through a capacitor 45. Plate 36 of the pentode 32 is connected to a dually tuned variable transformer 17 of the same configuration as transformer 17 in stage 11. Specifically, the plate 36 of the pentode 32 is connected to one side of the primary winding 18 of the transformer 17. The other end of the primary is connected through resistor 23 and capacitor 24 to ground. Connection is made from the screen grid 34 to the junction of resistors 21 and 23. The junction of resistors 23 and capacitor 24 is connected to the other side of the coil 28. One side of a further coil 28 is also connected to this point. The other end of the coil is connected to a like ground point in the next stage of amplification 51 of the main amplification chain. The secondary of the transformer 17 is connected in like manner to the secondary of transformer 17 in stage 11. Diode limiter stage 81 is of like configuration to the one mentioned hereinbefore in conjunction with stage 11. Further, in a similar manner, a lead goes from the output of the second diode limiter stage 81 to second side amplifier 91. This lead is also labeled A. Another connection is made from the output of limiter stage 81 to a third main IF amplification stage 51 of like configuration to the stage just described hereinabove. The output of this main IF amplifier stage 51 goes to another diode limiter stage 81. An output from diode limiter stage 81 goes to main IF amplification stage 71 of exactly the same configuration as the main IF amplification stages 31 previously mentioned, with the exception that, in place of the resistor 23, there is a Zener diode 72. The output of the main IF amplifier stage 71 is connected to a further diode limiter stage 81. The output therefrom goes to a fourth side amplifier stage 91, to be described hereinbelow. The connections between the coils 27 and 28 in each of the main stages of amplification is terminated in a resistive T network consisting of a series resistor 73, adjustable resistor 74 and a parallel resistor 75. The other end of resistor 75 is connected to a ground point and is also connected to the last coil 28, which appears in the main IF amplification stage 71. The other end of the last of the coils 28 in the chain is connected to a B+ voltage and is also connected to a further RF coil 76 which has a lead, the other end of which goes to all of the side amplification stages 91. This lead is labeled C. This junction also is referred to a ground point through a capacitor 77. The other end of the adjustable resistor 74 goes to all of the side amplification stages and is labeled B. This terminal is also connected to ground point through parallel combination of resistor 78 and capacitor 79.

The main chain of amplification consists of the four stages 11, 31, 51 and 71. Stage 11 consists of the triode 12 in ground grid configuration. In order that the amplifier be properly terminated, it is necessary to design this stage so that its cathode input impedance is of critical resistive value. The transformers 17 are designed to be transitionally coupled double tuned with a band width of approximately 13 mc./s. All three of the transformers were made identical for the purposes of simplicity. A load across the primary of the transformer 17 is made up of the $r_p$ of the tube coil losses and a physical resistor 22. Thus, the load is calculated by taking the calculation for the $r_p$ of the tube in parallel with the fixed resistor to give a value suitable for termination or coupling from stage to stage. Obviously, the $r_p$ of tube 12 is different from that of tube 32 and appropriate calculations must be made for each tube. After values of resistance are calculated, it may be observed that the resistive values utilized in a particular embodiment do not coincide with the values actually calculated. This may be caused by imperfections in the transformer's input and output, and capacitance and resistance may be assumed incorrectly. The transconductance of each stage ($g_m$) must be chosen in order that side gain of each stage of amplification be present.

It is necessary to choose a frequency for each stage which is higher than the desired overall frequency when cascading two networks. The tube 32 in stage 71 may be operated at a reduced plate voltage, so that the tube operates at a high transconductance and still stays within the plate dissipation ratio. The reduced plate voltages are obtained by means of the Zener diodes 72 appearing in the plate circuit. The potentiometers 44 appearing in the cathode circuit of each of the tubes 32 are used to adjust the gain of these stages during alignment. The use of a large cathode resistance comprising resistors 42, 43 and 44 provides greater DC degeneration and thus improves gain stability. The resistor 38 was placed in the suppressor grid circuit, since the devices may indicate some evidence of instability without the inclusion of this resistor. In an embodiment of the invention, the tubes 32 used had greater transconductance values than was needed. Therefore, a bypass cathode resistor 43 was used to produce an AC degeneration and thereby increase the stability of the device.

Turn now to FIG. 3, which is a logarithmic graph of output voltage versus the input voltage, in conjunction with FIG. 2, for a complete understanding of the operation of the invention as it pertains to operation of the limiters 81. The solid curves 84 at the bottom of FIG. 2 indicate the individual limiter characteristics of the four stages of limitation. When the outputs of all four stages are added together in the delay line 111, they produce the solid line 85, a logarithmic curve output. The scalloped dotted line 86 represents the output, if the limiters' characteristics are assumed to be sharp; that is, if there is an instantaneous change from the nonconducting to the conducting stage. This curve represents a theoretical situation and is a practical impossibility. The diodes, in fact, have a certain curvature as they go into conduction. The shape of limiter characteristics is determined by the characteristic of the limiter itself and the signal source driving it.

Assuming that the diodes do gradually go into limitation, it may be seen that the scalloped curve can be compensated for and straightened out if the limit characteristics of the diodes can be properly shaped producing the solid line 85 on FIG. 3 drawn tangentially to the scalloped curve. The curve is logarithmic between points A and B. Below point A, the curve is linear in order to obtain a logarithmic response to the weakest signals at lowest level. It is necessary to have sufficient gain so that the lowest level is about at point A.

If the level is set such that its value is at point A, a large portion of the time the noise input will be below that point. A base clipping circuit is provided to eliminate the linear region below point A, since this condition uncompensated may have an adverse effect on the signal to noise ratio. Therefore, at input levels below point A on the curve, the curve will follow the base clip level.

Each side amplifier 91, as shown in FIG. 4, consists of a pentode 92 having an adjustable resistor 96 in the cathode circuit, the input signal from the main IF amplifier stages 11, 31, 51 and 71 being applied on lead A and through coupling condenser 94 to the control grid of tube 92. The output from the pentode 92 is applied to a singly tuned circuit 93 located between the pentode 92 and a further pentode 97. This circuit is biased by a Zener diode 95. The detector circuits 101 are coupled to the side IF amplifier circuits 91 via a single tuned transformer 102. This leads to a diode 103 which in turn leads through a coil 15 to a parallel capacitor resistor arrangement 104 and 105, respectively. Connected between the coil and this parallel arrangement is a resistor 107 which goes to ground through the further parallel combination of resistor 108 and capacitor 109.

The side IF amplifiers 91, as shown in FIG. 4, are identical for each particular main IF amplifier. Side circuits provide the major part of the band pass characteristics of the overall device. The pentode 92 is used to isolate the high Q single tuned circuit 93 in the plate circuit of the pentode 92 from the doubly tuned transformers 17 in the main stages of amplification. Drift due to temperature instability of the circuit 93 may be compensated for by making part of its capacitance have a negative temperature coefficient. It is undesirable to have any gain between the limiter and the narrow band network. The slight gain introduced by the pentode 92 is used to make up for losses incurred by the capacitor 94 which couples the main stage of amplification to the individual side circuits. This small coupling capacitor permits a greater gain width product in the main chassis, since it minimizes the loading, due to the side circuit loss in single amplitude as this capacitor is equal to the gain of the two. The tube 92 is operated with a reduced plate voltage so that more gain may be obtained from it without exceeding its maximum plate dissipation rating. The plate voltages are reduced by using the Zener diode 95 in the plate circuit. The potentiometer 96 in the cathode circuit of the tube 92 is used to adjust the gain of the stage during alignment before use. The output tube 97 is used to raise the signal to a level with the detector diodes 103.

The polarity of the output signal may be changed by reversing the polarity of the detector diodes 103 in the detector circuit 101. The resistor 105 is a summing resistor and the capacitor 104 in parallel with it is used to improve video response. The gain of the first side circuit 91 coming from main amplification stage 11 is set a little bit higher than the other side circuit in order to increase the limiting level of the first limiting diode. This is done to increase both the linear and dynamic range of the logarithmic characteristic. The junction 106 may be used on a power input junction to inject a base clipping voltage in the device. This voltage merely changes the signal level at which the detector begins to conduct. Such a voltage is only used on the last side circuit in the cascade. In all other stages, it is ground to the main amplification ground.

Further temperature instability may be compensated for by utilizing thermistor or like devices either within each individual stage of amplification or by using one such device for many stages. For example, a thermistor may be placed in the cathode circuit of each side amplifier and a single thermistor may control the temperature of the entire main amplification chain.

Thus a new and improved logarithmic amplifier has been fully disclosed which uses successive detection and permits instantaneous response to all signal levels.

Obviously many modifications and variations of the present invention are possible in the light of the above teachings. It is therefore to be understood that within the scope of the appended claims the invention may be practiced otherwise than as specifically described.

What is claimed is:

1. A logarithmic amplifier comprising:
   a first plurality of amplifiers connected in cascade;
   a like plurality of signal limiting devices connected between said plurality of first amplifiers in said cascade;
   a second and like plurality of amplifiers, one connected to each of said limiters;
   a like plurality of detector circuits connected to said second plurality of amplifiers; and
   a summation circuit connected to each of said plurality of said detectors.

2. The device of claim 1 wherein said plurality of limiting devices each comprise:
   two unidirectional current devices connected in parallel and in opposite directions of conductivity.

3. The device of claim 1 wherein said summation circuit further comprises a delay line.

4. The device of claim 2 wherein said unidirectional current devices are semiconductor diodes.

5. The device of claim 4 wherein said summation circuit further comprises a delay line.

6. A logarithmic amplifier comprising:
   a plurality of first amplifier means connected in cascade;
   a like plurality of limiting diode devices connected between said plurality of amplifier means;
   a like plurality of second amplifier means, one connected to each of said limiting devices;
   a like plurality of detector means connected to said second plurality of amplifier means; and
   a delay and summation network to which said detector means are connected.

7. The device of claim 6 wherein each of said limiting devices further comprise:
   a pair of silicon diodes connected in parallel and in opposite directions of conductivity.

References Cited

UNITED STATES PATENTS

| | | | |
|---|---|---|---|
| 2,662,978 | 12/1953 | Sunstein | 328—145 X |
| 2,941,076 | 6/1960 | Congdon et al. | 329—1 |
| 3,061,789 | 10/1962 | Mace | 328—145 X |

OTHER REFERENCES

Epprecht: "A New Type Instantaneous Logarithmic Wide-Band Amplifier," U.S. Dept. of Commerce—OTS pp. 1–3, PB 121485, May 1955.

RCA Review, vol. XVIII, No. 1, pp. 98–107, "Linear-Logarithmic Amplifier," March 1957.

ALFRED L. BRODY, *Primary Examiner.*